(12) United States Patent
Fernandez et al.

(10) Patent No.: US 6,397,370 B1
(45) Date of Patent: May 28, 2002

(54) METHOD AND SYSTEM FOR BREAKING COMPLEX BOOLEAN NETWORKS

(75) Inventors: Jean-Michel Fernandez, Antibes; Gerard Tarroux, Villenneuve-Loubet, both of (FR)

(73) Assignee: Candence Design Systems, Inc., San Jose, CA (US)

(*) Notice: Subject to any disclaimer, the term of this patent is extended or adjusted under 35 U.S.C. 154(b) by 0 days.

(21) Appl. No.: 09/216,357

(22) Filed: Dec. 18, 1998

(51) Int. Cl.⁷ .............................................. G06F 17/50
(52) U.S. Cl. ................................................ 716/2; 716/7
(58) Field of Search ............................................ 716/2

(56) References Cited

U.S. PATENT DOCUMENTS

| | | | | |
|---|---|---|---|---|
| 5,297,150 A | * | 3/1994 | Clark | 371/19 |
| 5,432,707 A | * | 7/1995 | Leung | 716/2 |
| 5,487,017 A | * | 1/1996 | Prasad et al. | 364/488 |
| 5,774,369 A | * | 6/1998 | Horstmann et al. | 716/2 |
| 5,913,101 A | * | 6/1999 | Murofushi et al. | 438/6 |
| 5,926,804 A | * | 7/1999 | Tufts et al. | 706/25 |
| 6,212,669 B1 | * | 4/2001 | Jain | 716/7 |

OTHER PUBLICATIONS

K. Keutzer, DAGON: Technology Binding and Local Optimization by DAG Matching, 24th ACM/IEEE Conference Proceedings on Design Automation, pp. 341–347, Jun. 1987.*

H. Cho et al., BEATNP: A Tool for Partitioning Boolean Networks, IEEE International Conference on Computer–Aided Design, pp. 10–13, Nov. 1988.*

* cited by examiner

*Primary Examiner*—Matthew Smith
*Assistant Examiner*—A. M. Thompson
(74) *Attorney, Agent, or Firm*—Lyon & Lyon LLP (57) ABSTRACT

A method and system reduces the complexity of functions within a Boolean network by breaking the network at certain nodes. Before the flattening phase of a technology independent optimization, the present invention estimates the on-set and off-set complexities of each node of the network. The complexities are estimated by considering the type of function represented by the node, the estimated complexities of any child nodes, and the number of variables in the support of the node. If a node's estimated complexity exceeds a defined complexity limit, then the network is preferably broken at that node. A new node of the same type as the complex node is created, and child nodes of the complex node are appended to the newly created node. In addition, an intermediate node is created as a child of the complex node and the child nodes are removed from the complex node. Removing the child nodes from the complex node reduces the complexity of the node and allows the minimization phase to better optimize the network.

22 Claims, 6 Drawing Sheets

METHOD AND SYSTEM FOR BREAKING COMPLEX BOOLEAN NETWORKS

COPYRIGHT NOTICE

A portion of the disclosure of this patent document contains material which is subject to copyright protection. The copyright owner has no objection to the facsimile reproduction by anyone of the patent document or patent disclosure, as it appears in the Patent and Trademark Office patent file or records, but otherwise reserves all copyright rights whatsoever

BACKGROUND

1. Field of the Invention

This invention pertains generally to digital circuit design and particularly to the technology independent optimization stage of the design process.

2. Background of the Invention

Modern logic circuits are so complex that circuit designers must use computer-based techniques to help them in their task. The designers first abstractly represent the circuit as multiple combinatorial blocks (e.g., single-output, multiple-input Boolean equations) separated by sequential states. The combinatorial blocks are described by Directed Acyclic Graphs ("DAGs", also referred to as Boolean networks or trees). In general, the computer-based techniques transform the abstract representation of the circuit design into a technology-dependent netlist representing the same circuit design.

Before converting the abstract representation of the circuit into a technology-dependent netlist, it is desirable to optimize the technology independent circuit design. There are three phases of optimization that are executed in sequence: flattening, minimization, and factorization. The flattening phase tries to remove intermediate functions in the Boolean network, the minimization phase tries to simplify the Boolean functions, and the factorization phase tries to reduce the number of literals in the "product of sum" form. These optimizations are often very successful.

However, the above-mentioned optimizations sometimes cannot be performed if the Boolean network is too complex. In practical terms, a Boolean network is "too complex" if the network is impossible to optimize in a reasonable amount of time using modern optimization algorithms implemented on state of the art computers.

Selective flattening is performed before the other two phases and is used to control the effect of the minimization phase. The selective flattening removes non-useful intermediate functions but avoids completely flattening the Boolean network. Since the flattening process may produce more complex Boolean functions than were previously present in the network, the first goal of the flattening phase is to guarantee that the other two phases of the Boolean optimization can be completed. Thus, the flattening process will not flatten a function if it estimates that the flattened function will be too hard to optimize.

However, some functions are already flat or are too complex for Boolean optimization even if the flattening phase is skipped. Therefore, the three-phase optimization approach does not work with such functions.

For example, consider the following Boolean function:

$$f = (a_0 + b_0 + c_0 + d_0 + e_0 + f_0 + g_0 + h_0 + i_0 + j_0) *$$
$$(a_1 + b_1 + c_1 + d_1 + e_1 + f_1 + g_1 + h_1 + i_1 + j_1) *$$
$$(a_2 + b_2 + c_2 + d_2 + e_2 + f_2 + g_2 + h_2 + i_2 + j_2) *$$
$$\ldots$$
$$(a_{15} + b_{15} + c_{15} + d_{15} + e_{15} + f_{15} + g_{15} + h_{15} + i_{15} + j_{15}).$$

This network is already flat and, therefore, the flattening phase will have no effect. Moreover, the minimization phase, which aims to reduce the number of cubes of the on-set of a function, is unable to optimize the network because there are $(a_0 * a_1 * a_2 \ldots a_{15}) + (a_0 * a_1 * a_2 \ldots a_{14} * b_{15}) + \ldots + (j_0 * j_1 * j_2 \ldots j_{15}) = 10^{16}$ cubes to consider. The memory and processing time needed to minimize a network having such a huge number of cubes is far above the acceptable limits for an integrated circuit design automation tool.

Therefore, there is a need to modify the optimization process to allow the minimization phase to effectively process complex Boolean networks. More specifically, there is a need to add a new optimization phase before the flattening phase that detects a complex Boolean network and modifies the network so that it can be processed in the subsequent phases.

SUMMARY OF THE INVENTION

The above needs are met by a method and system for reducing the complexity of certain nodes in the Boolean network. In one embodiment, the present invention is a "network breaker" or a "network breaking phase" of the optimization process that executes just before the flattening phase. The network breaker reduces the complexity of nodes in the network by adding additional nodes to the network.

The network breaker preferably visits each node (i.e., Boolean function) of the Boolean network. In one embodiment, the network breaker considers the nodes in a depth-first order. In an alternative embodiment, the network breaker first visits those nodes having the largest support intersection.

The network breaker estimates the complexity of each node it visits. In a preferred embodiment of the present invention, the estimation of a node's complexity is measured with two components: the on-set complexity and the off-set complexity. For an AND node, the on-/off-set complexity is estimated as the minimum of:

the product of the estimated on-/off-set complexities of the children of the AND node; and the maximum number of cubes that can be created from the AND node. For an OR node, the on-/off-set complexity is estimated as the minimum of:

the sum of the estimated on-/off-set complexities of the children of the OR node; and the maximum number of cubes that can be created from the OR node. The complexities of a NOT node are estimated by swapping its estimated on-set and off-set complexities. In addition, the on-set and off-set complexities of a leaf node (a node without any children) are by definition equal to one.

Alternative embodiments of the present invention use different complexity estimates. For example, one embodiment also estimates the don't care complexity. An alternative embodiment used with binary decision diagram minimization uses a cost function based on the ordering of variables.

If the estimated on-set complexity of a node exceeds an on-set limit or the estimated off-set complexity of the node exceeds an off-set limit, the network breaker "breaks" the network by creating a new node of the same type (i.e., AND, OR, NOT) as the too-complex node. Child nodes are removed from the too-complex node and are appended to the new node. In addition, a new intermediate node is created having the formerly too-complex node as its parent and the new node as its child. Under certain circumstances, the network breaker inverts the function rather than inserting a new intermediate node. In addition, the limits used in the network breaker should also be used in the flattening phase to avoid destroying the effects of the breaking phase.

DETAILED DESCRIPTION OF THE PREFERRED EMBODIMENTS

As a preliminary matter, it is necessary to define the following terms:

Boolean function: A Boolean function is a logical operation on one or more inputs such as AND (*), OR (+), or NOT. A Boolean function can be represented by either its on-set and its dc-set or by its off-set and its dc-set.

Boolean network or tree: A Boolean network is a set of Boolean function definitions. A Boolean network $B_n$ can be represented as a directed, acyclic graph ("DAG," also referred to as a Boolean tree) such that, for each node $N_i$ in $B_n$, there is an associated Boolean function $f_i$, and a Boolean variable $y_i$ representing $f_i$. There is a directed edge from $N_i$ to $N_j$ if $f_i$ explicitly depends on $y_i$ or $\bar{y}_i$. In this description, a Boolean network is represented using two categories of nodes: Nary nodes each having N children, and Unary nodes each having a single child. The Boolean AND operation is represented with an AND Nary node, the Boolean OR operation is represented with an OR Nary node, and the Boolean NOT operation is represented with a NOT Unary node.

Parent/Child Node: The parent node is the node $N_j$ to which the directed edge points. The child node is the node $N_i$ from which the directed edge points.

Primary Inputs/Outputs: The primary inputs or primary outputs refer to the inputs and outputs of the Boolean network which will be optimized. Thus, the primary inputs/outputs are not limited to the inputs or outputs of the design, storage element, or any internal node of the design which has a defined starting point for the Boolean optimizer, such as the inputs and outputs of a hierarchical cell.

Intermediate Node: This term refers to any node inside the Boolean network which is neither a primary input nor a primary output.

Root Node: This term refers to the highest (i.e., ultimate parent) node in the Boolean network or portion of the network being analyzed. The root node may be a primary output or an intermediate node in the Boolean network.

Leaf Node: This term refers to the lowest node in the Boolean network or portion of the network being analyzed. The leaf node may be a primary input or an intermediate node in the Boolean network.

Internal Node: This term refers to a node in the Boolean network or portion of the network being analyzed that is neither a root node nor a leaf node.

Literal: A literal is a variable such as a primary input or intermediate node or its negation. For example, a literal may be "a" or "$\bar{a}$."

Cube: A cube, or product term, is a set C of literals such that $x \in C$ implies $\bar{x} \notin C$. For example, $\{a, b, c\}$ is a cube and $\{a, \bar{a}\}$ is not a cube. A cube represents the product (conjunction) of its literals.

Sum-Of-Products ("SOP"): The SOP is a Boolean sum of cubes. For example, $f=(a*b)+(\bar{c}*d)$ is an SOP.

Product-Of-Sums ("POS"): The POS is a Boolean product of a sum. For example, $f=(a+b)*(\bar{c}+d)$ is a POS.

Minterm: A minterm is a cube with only '0' and '1' entries. That is, the cube does not have don't care entries.

On-set: The on-set of a function is the set of minterms for which the function evaluates to '1'.

Off-set: The off-set of a function is the set of minterms for which the function evaluates to '0'.

Don't-Care Set ("dc set"): The dc set of a function is the set of minterms for which the value of the function is unspecified. Support: The support of a function is the set of variables used in the definition of the function. For example, let f be a Boolean function defined as $f=(a*b)+(c*\bar{d})+e$. The support of f is $\{a, b, c, d, e\}$.

Support Intersection: The support intersection is the set of variables common to several functions. For example, let f and g be two Boolean functions with the support $\{a, b, c, d\}$ and $\{a, c, e, f\}$ respectively. The support intersection of f and g is $\{a, c\}$.

The above-defined terms are well known to those of ordinary skill in the art and, except where stated above, each term is meant to include its normal and ordinary meaning.

Figure 1:
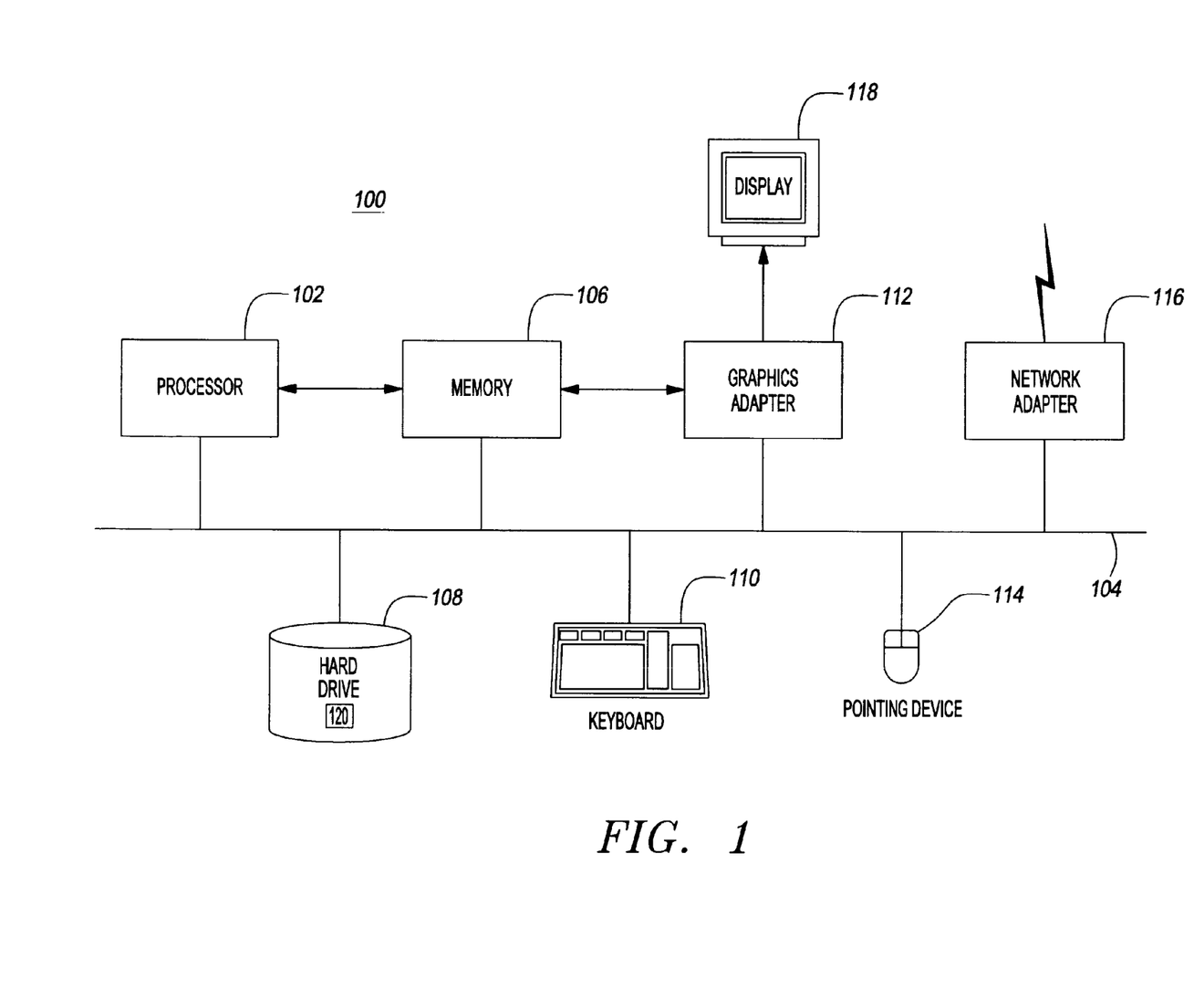
FIG. 1 is a high-level block diagram of a computer system for performing network breaking according to one embodiment of the present invention.

The present invention is a "network breaker," or a "network breaking phase," that acts or is performed just before the flattening phase of optimization. FIG. 1 is a high-level block diagram of a computer system 100 for performing network breaking according to one embodiment of the present invention. Illustrated are at least one processor 102 coupled to a bus 104. Also coupled to the bus 104 are a memory 106, a storage device 108, a keyboard 110, a graphics adapter 112, a pointing device 114, and a network adapter 116. A display 118 is coupled to the graphics adapter 112.

The at least one processor 102 may be any general-purpose processor such as an INTEL x86 compatible—or SUN MICROSYSTEMS SPARC compatible—central processing unit (CPU). The storage device 108 may be any device capable of holding large amounts of data, like a hard drive, compact disk read-only memory (CD-ROM), DVD, or some form of removable storage device. The memory 106 holds instructions and data used by the processor 102. The pointing device 114 may be a mouse, track ball, light pen, touch-sensitive display, or other type of pointing device and is used in combination with the keyboard 110 to input data into the computer system 100. The graphics adapter 112 displays images and other information on the display 118. The network adapter 116 couples the computer system 100 to a local or wide area network (not shown).

Program modules 120 for performing network breaking, i.e., the network breaker 120, according to one embodiment of the present invention are stored on the storage device 108, loaded into the memory 106, and executed by the processor 102. Alternatively, hardware or software modules may be stored elsewhere within the computer system 100 for performing network breaking as described herein.

Figure 2:
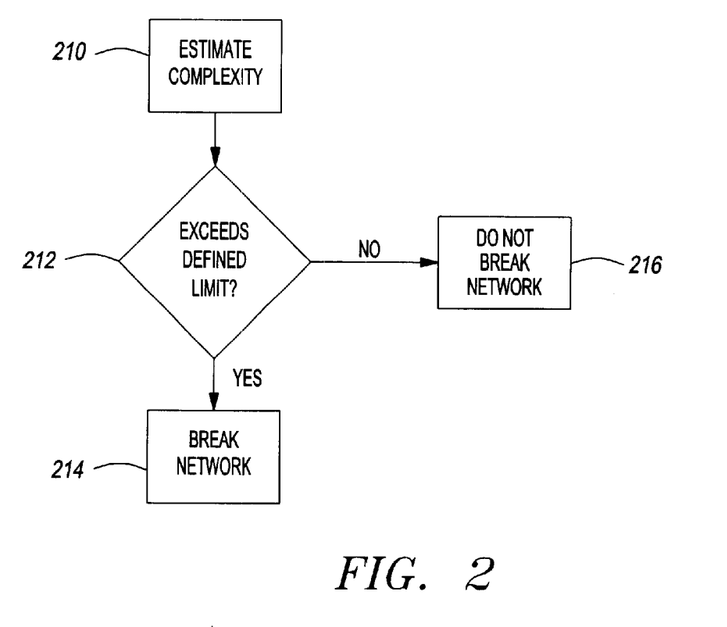
FIG. 2 is a flowchart illustrating the high-level steps for network breaking perform by a preferred embodiment of the present invention.

FIG. 2 is a flowchart illustrating the high-level steps for network breaking performed by a preferred embodiment of the present invention. The network breaker examines each function in the Boolean network. For each function, the network breaker estimates 210 the complexity of the network sub-tree descending from the node of the function.

The complexity estimation performed on each function of the network is preferably pessimistic, meaning that the real complexity will always be lower than or equal to the estimation. With some Boolean functions, the estimation can be far greater than the real complexity. However, it is desirable to minimize CPU 102 usage at the cost of less accurate complexity estimations. In addition, it is desirable to have a worst-case estimation in order to be sure that the minimization will not require too much CPU 102 time. As a result of using pessimistic estimation, however, the network breaker will sometimes unnecessarily break functions.

One embodiment of the present invention estimates the complexity of the Boolean sub-tree descending from the node of a function as the number of cubes in the on-set and/or the off-set of the function. Estimating the complexity 210 of a NOT node is performed by swapping its child node's on-set complexity with the child node's off-set complexity. Estimating the complexity of an OR node is performed by taking the minimum of:

the sum of the complexity of the children of the OR node; and the maximum number of cubes that can be created from the OR node. Similarly, estimating the complexity of an AND node is performed by taking the minimum of:

the product of the complexity of the children of the AND node; and the maximum number of cubes that can be created from the AND node. For both OR and AND nodes, the maximum number of cubes that can be created from a node is given by the following formula: ($2^{size\ of\ support\ of\ node}$)−1. The estimated complexity of a leaf node is one.

The estimated complexity is measured against a defined limit such as the maximum number of cubes in either the on-set or the off-set that can be handled by the minimization phase. If the estimated complexity exceeds the defined limit 212, then the network breaker 120 breaks 214 the network by adding a new internal function.

An alternative embodiment of the present invention uses a different cost function than the one presented above. For example, if a binary decision diagram ("BDD") minimization phase will be used during the optimization process, the cost function should be based on the ordering of variables in the BDD. However, the need to break the complex BDD representations is still valid and the behavior of the network breaker is identical to the behavior described herein.

Figure 3A:
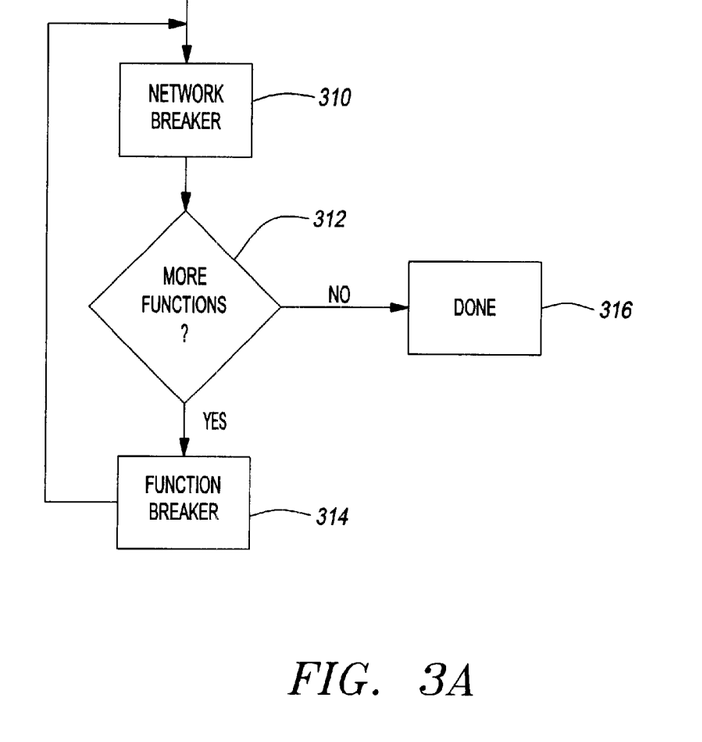
FIG. 3 illustrates a series of flowcharts describing the operations performed by pseudocode for network breaking.
Figure 3B:
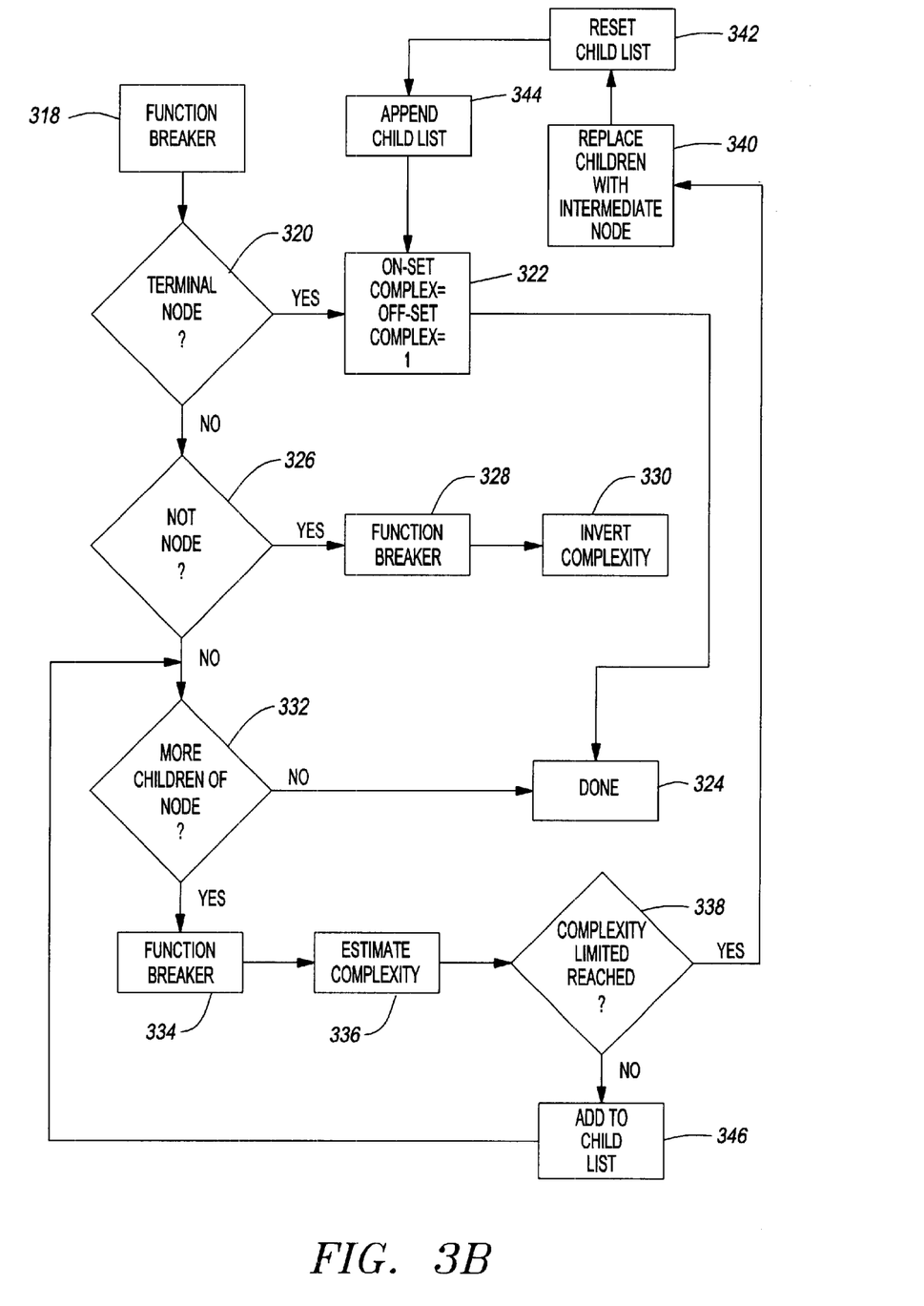
Figure 3C:
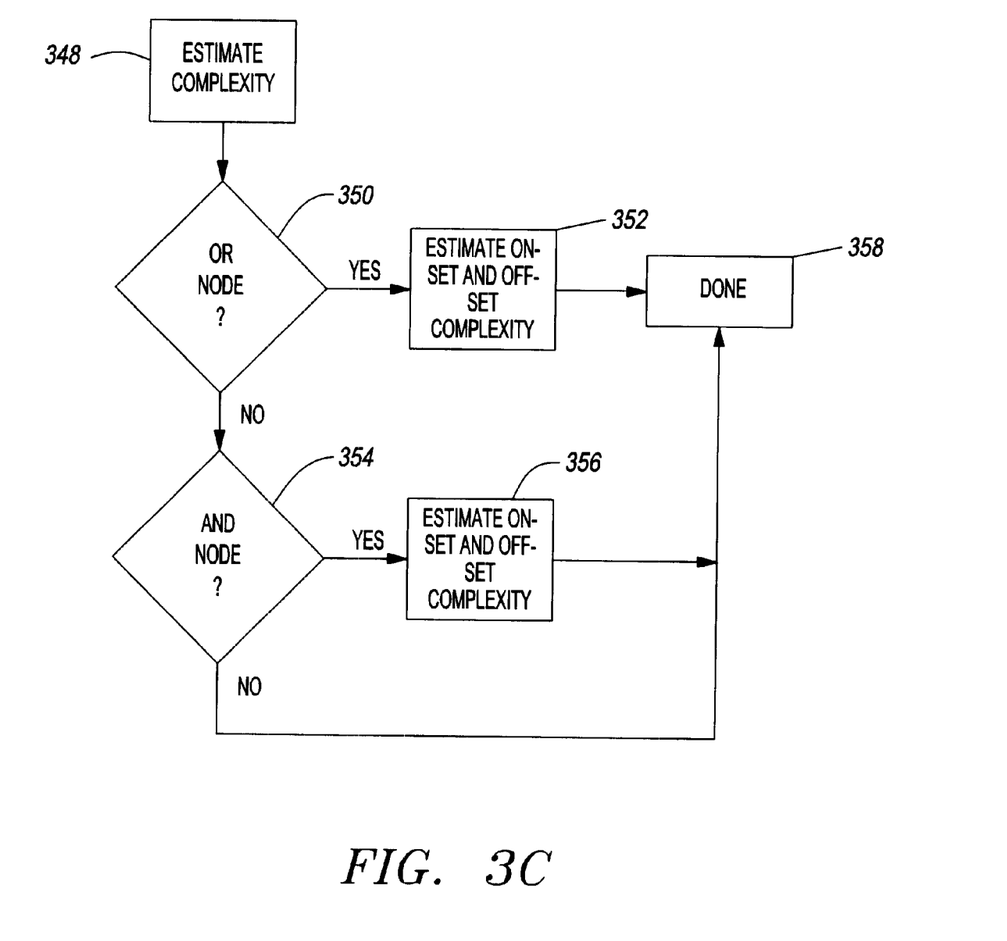

The computer program listing at the end of the detailed description but before the claims illustrates pseudocode for implementing the network breaker according to a preferred embodiment of the invention. FIGS. 3A–C illustrates a series of flowcharts describing the operations performed by the pseudocode. Due to the recursive nature of the pseudocode, the separate flowcharts forming FIGS. 3A–C each represent a function of the pseudocode. Each flowchart contains at least one box labeled with the name of the function. Each occurrence of such a box represents an invocation of the named function, as explained in detail below.

FIG. 3A illustrates the operation of the NETWORK_BREAKER function 310. This function performs the main control for the network breaking phase of the present invention. The NETWORK_BREAKER function 310 is passed a parameter, "network", referencing the Boolean network to be analyzed. For each function in "network", NETWORK_BREAKER 310 calls the function FUNCTION_BREAKER 314 and passes it the node of the function, the on-set and off-set limits for the optimizer, and the current estimated on-set and off-set complexities. Once every function in "network" has been considered, the network breaker is finished.

FIG. 3B illustrates the operation of the FUNCTION_BREAKER function 318. The FUNCTION-BREAKER function 318 receives the parameters passed to it, including the node under consideration. If the node is a leaf node, then the estimated on-set and off-set complexities for the node are each set to one and the function returns.

If the node represents a logical NOT function, then the function FUNCTION_BREAKER 328 is recursively called and passed the child of the current node. Once FUNCTION_BREAKER returns, the function INVERT_COMPLEXITY 330 is called to swap the estimated on-set and off-set complexities for the node. Once INVERT_COMPLEXITY returns, the function FUNCTION_BREAKER also returns.

If the node represents a logical AND or OR function, then for each child node 332, the function FUNCTION_BREAKER 334 is recursively called with the child node. In addition, the function ESTIMATE_COMPLEXITY 336 (described by FIG. 3B) is called to estimate the complexity of the node as each child node is considered. If the complexity limit of the node is reached 338, i.e., either the estimated on-set or off-set complexity exceeds its respective limit, then the function REPLACE_CHILDREN_BY_INTERMEDIATE 340 is called to break the function by adding a new intermediate node. The list of child nodes is appended to the newly created node and removed from the node currently being processed. The list of child nodes is then reset to include the new intermediate node (which has estimated on-set and off-set complexities of one) and FUNCTION_BREAKER continues with the next child of the node currently being processed. If the complexity limit is not reached 338 after the complexity of a child node is estimated 336, then that child node is appended 346 to the list of child nodes of the parent (i.e., the network is not broken at this node).

FIG. 3C illustrates the operation of the ESTIMATE_COMPLEXITY function. This function receives 348 parameters including a node, the node's estimated on-set and off-set complexities (i.e., the total estimated complexities of the child nodes that have been previously considered), and a child node's estimated on-set and off-set complexities. If the node represents a logical OR operation 350, then the ESTIMATE-COMPLEXITY function estimates 352 the node's on-set complexity as the minimum of:

the previous estimated on-set complexity plus the estimated on-set complexities of the child nodes; and $2^{size\ of\ support\ of\ node}-1$ The node's estimated off-set complexity is calculated 352 as the minimum of:

the previous estimated off-set complexity multiplied by the estimated off-set complexity of the child node; and $$2^{size\ of\ support\ of\ node} - 1$$

If the node represents a logical AND operation 354, then the ESTIMATE_COMPLEXITY function estimates 356 the node's on-set complexity as the minimum of:

the previous estimated on-set complexity multiplied by the estimated on-set complexity of the child node; and $$2^{size\ of\ support\ of\ node} - 1$$

The node's estimated off-set complexity is calculated 356 as the minimum of:

the previously estimated off-set complexity plus the estimated off-set complexity of the child node; and $$2^{size\ of\ support\ of\ node} - 1$$

Once the estimated complexities are calculated, the function returns 358.

Figure 4A:
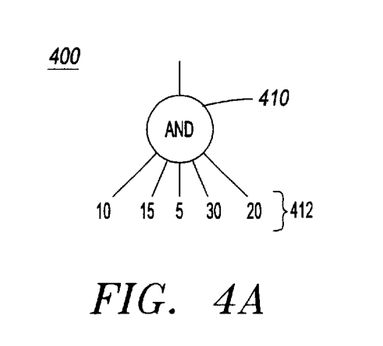
FIG. 4 illustrates Boolean trees having a parent node and child nodes.
Figure 4B:
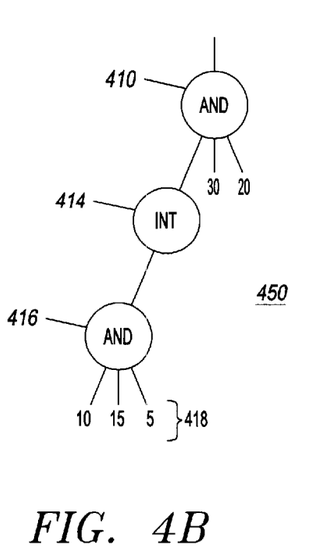

FIGS. 4A and 4B illustrate the operation of the REPLACE_CHILDREN_BY_INTERMEDIATE function on a Boolean tree 400 when called by FUNCTION_BREAKER at step 340. FIG. 4A illustrates a Boolean tree 400 having a root node 410 and five child nodes 412. Assume for purposes of this example that the on-set limit is 1000 and the estimated on-set complexities of the leftmost three child nodes are 10, 15, and 5, respectively.

Since the root node 410 is an AND node, its on-set complexity is estimated as 10*15*5*30*20=450,000. Accordingly, the maximum number of nodes that can be grouped without exceeding the on-set limit are broken from the root node 410 and made children of an intermediate node.

FIG. 4B illustrates a tree 450 resulting after the tree of FIG. 4A is broken according to the present invention. The tree 450 has a new intermediate node 414 having a complexity of one in place of the three child nodes having the complexities of 10, 15, and 5 in the original tree 400. Since the node that was broken is an AND node, the sole child of the new intermediate node 414 is a newly created AND node 416. The AND node 416, in turn, has as children the three nodes having the complexities 10, 15, and 5 that were broken from the parent node 410 in the original tree 400.

Figure 5A:
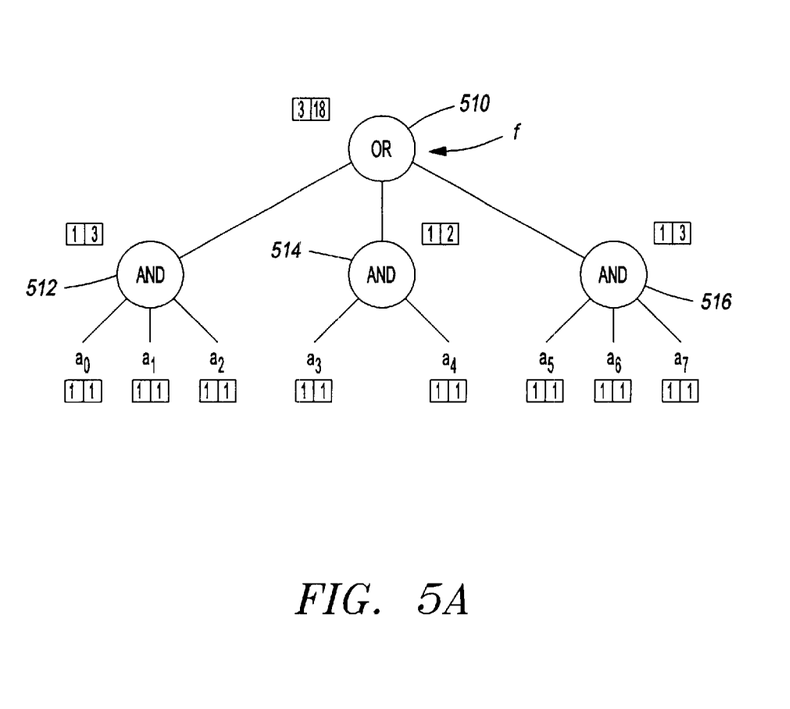
FIG. 5 illustrates Boolean trees and shows an example of cost estimation and network breaking as performed by the steps illustrated in FIG. 3.
Figure 5B:
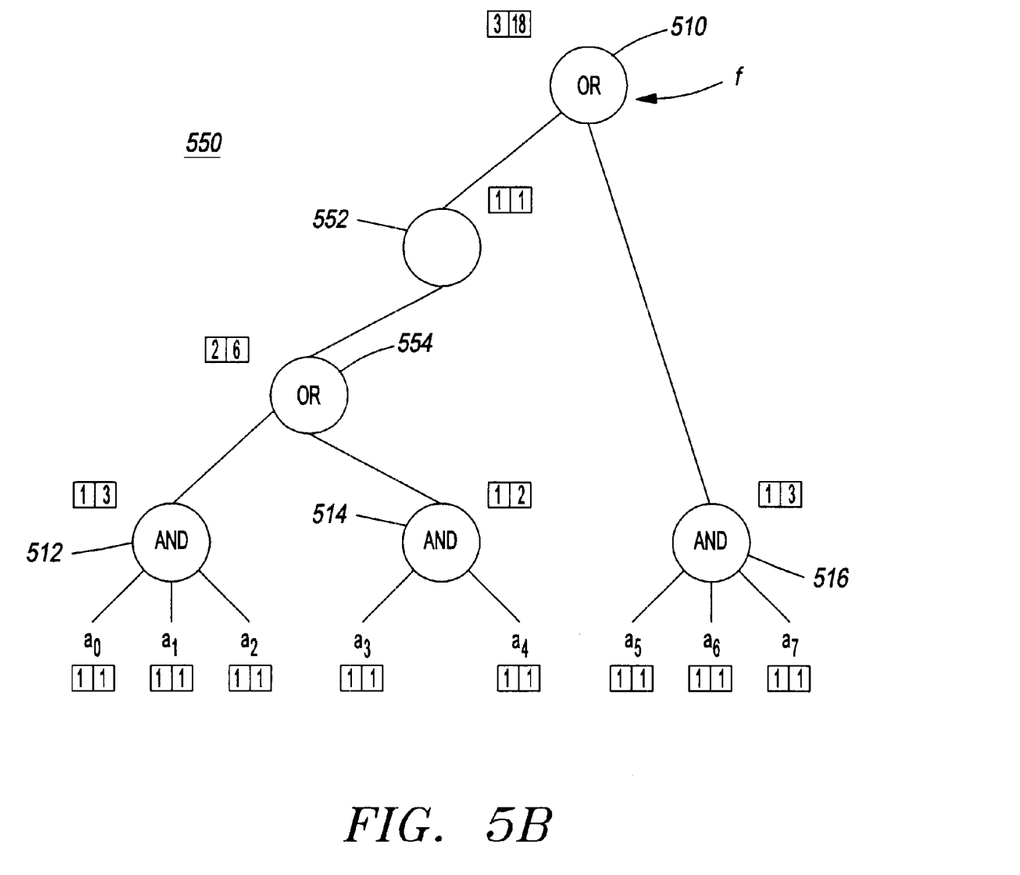

FIGS. 5A and 5B are Boolean trees illustrating an example of cost estimation as performed by the steps of the flowcharts of FIGS. 3A–C. FIG. 5A illustrates the Boolean tree 500 for the equation $f=(a_0*a_1*a_2)+(a_3*a_4)+(a_5*a_6*a_7)$. The Boolean tree 500 has a root OR node 510 with three child AND nodes 512, 514, 516. AND node 512 has three child nodes $a_0, a_1, a_2$, AND node 514 has two child nodes $a_3, a_4$, and AND node 516 has three child nodes $a_5, a_6, a_7$. Next to each node is a pair of numbers. The number on the left indicates the on-set estimation for the node and the number on the right indicates the off-set estimation for the node. For example, the parent OR node 510 has an estimated on-set complexity of three and an estimated off-set complexity of 18.

As explained in the description of FIG. 3A–C, the leaf nodes $a_0$–$a_7$ have estimated on-set and off-set complexities of one (see step 322). For each of the AND nodes 512, 514, 516, the estimated on-set complexity is the product of the estimated child on-set complexities and the estimated off-set complexity is the sum of the estimated child off-set complexities. The on-set complexity estimation of the OR node 510 is the sum of the child nodes' (the three AND nodes') estimated on-set complexities and the off-set complexity estimation is the product of the child nodes' estimated off-set complexities.

Assume for purposes of the example of FIG. 5 that the on-set limit is four and the off-set limit is 16. FIG. 5B shows the tree 550 of FIG. 5A after the tree has been broken by the network breaker of the present invention. The estimated on-set and off-set complexities of the three AND nodes 512, 514, 516 of FIG. 5A do not exceed the complexity limits and are not broken. The OR node 510, however, has an estimated off-set complexity of 18. Therefore, the OR node 510 is broken in FIG. 5B.

Accordingly, a new intermediate node 552 is created having a new child node 554. The new child node 554 is an OR node because the node 510 that was broken is an OR node. The two AND nodes 512, 514 that were broken from the parent node 510 are made children of the new OR node 554. As shown in FIG. 5B, all of the nodes in the broken tree 550 have on-set and off-set complexity estimations within the on-set and off-set limits.

An alternative embodiment of the present invention inverts the complex Boolean function rather than breaking the network. Inverting the Boolean function is particularly useful when the on-set of a function is in the POS form. In practice, the on-set cost of a function in the POS form is likely to be higher than the off-set cost and the on-set limit is usually lower than the off-set limit. Accordingly, such a function is likely to be broken due to its on-set limit.

For example, consider the function: $f=(a_0+b_0+c_0)*(a_1+b_1+c_1)$. The on-set cost of the function is nine and the off-set cost is two. Assuming an on-set limit of eight and an off-set limit of 32, the network breaker described above would break the function and add an extra internal node, resulting in the functions:

$f=f_{int}*(a_1+b_1+c_1)$; and $f_{int}=a_0+b_0+c_0$.

However, breaking the network in this manner is not useful because the minimization phase may not be able to simplify the broken network. However, the minimization phase will be able to handle the initial function if it is inverted to be expressed in its SOP form:

$f=\overline{f_{sop}}$; and $f_{sop}=(\overline{a_0}*\overline{b_0}*\overline{c_0})+(\overline{a_1}*\overline{b_1}*\overline{c_1})$.

For example, assume that $a_0=a_1$, $b_0=b_1$, and $c_0=c_1$. If f is inverted instead of broken, f can be minimized into:

$f=\overline{f_{sop}}$; and $f_{sop}=\overline{a_0}*\overline{b_0}*\overline{c_0}$.

To address this problem, an embodiment of the present invention inverts the function instead of adding a new intermediate node when the following conditions are true:

the on-set estimation is larger than the on-set limit; and the on-set estimation is lower than the off-set limit; and the off-set estimation is lower than the off-set limit; and the off-set estimation is lower than the on-set limit.

In addition, although the description above focuses on the on-set and off-set complexities of the Boolean functions, the present invention can be extended to include the dc-set complexities.

Returning to FIG. 2, in another alternative embodiment the network breaker examines 210 the nodes of the Boolean network having the largest support intersection in order to improve the results of the minimization phase, rather than examining the functions of the network in the order in which the nodes appear. For example, consider the function:

$f=a*b*c+d*e+a*\overline{c}$ and assume that the network breaker breaks the network after the second cube, which produces the new network:

$$f = f_1 + a*\bar{c};$$

$$f_1 = a*b*c + d*e.$$

One can observe that by reordering the nodes of the initial function f into $$f = a*b*c + a*\bar{c} + d*e,$$

the resulting broken network $$f = f_1 + d*e; \text{ and}$$

$$f_1 = a*b*c + a*\bar{c}$$

is better minimized because $f_1$ can be further minimized to:

$f_1 = a*b + a*\bar{c}$, which saves one literal over the original broken network.

In summary, the present invention is a network breaker that reduces the complexity of Boolean networks in order to allow more effective and efficient optimization by a technology-independent optimization process. Preferably, the present invention performs a pessimistic estimation of the on-set and off-set complexities of each node in the Boolean network. If the complexity of a node exceeds the complexity limit, the network is broken at that node (the too-complex node) by creating a new intermediate node and moving some of the child nodes of the too-complex node to the new node, thereby reducing the complexity of the too-complex node.

The following is pseudocode for implementing a network breaker according to a preferred embodiment of the invention:

```
NETWORK_BREAKER (network) {
    Foreach functionOf(network) do {
        FUNCTION_BREAKER (on Set Of(function), on-set-limit, on-set
        complexity, off-set-complexity)
    }
}
FUNCTION_BREAKER (node, on-set-limit, off-set-limit,
on-set-complexity, off-set-complexity) {
    if isATerminal(node) {
        on-set-complexity = 1;
        off-set-complexity = 1;
    } else if isANot(node) {
        FUNCTION_BREAKER(childOf(node),on-set-limit, off-set-limit,
            child-on-set-complexity, child-off-set-complexity);
        invertComplexity(on-set-complexity, off-set-complexity);
    } else {          // a And or a Or
        Foreach childOf(node) do {
            FUNCTION_BREAKER(childOf(node), on-set-limit,
            off-set-limit,
                child-on-set-complexity, child-off-set-complexity);
            ESTIMATE_COMPLEXITY(node, on-set-complexity,
                off-set-complexity, child-on-set-complexity,
                child-off-set-complexity);
            if COMPLEXITY_LIMIT_REACHED(on-set-limit,
            off-set-limit,
                on-set-complexity, off-set-complexity) {
                intermediate =
                REPLACE_CHILDREN_BY_INTERMEDIATE(node,
                childrenList);
                reset(childrenList);
                append(childrenList, intermediate);
                on-set-complexity = 1;
                off-set-complexity = 1;
            } else {
                append(childrenList, childOf(node));
```

-continued

```
            }
        }
    }
}
COMPLEXITY_LIMIT_REACHED(on-set-limit, off-set-limit,
on-set-complexity
        off-set-complexity) {
    return (on-set-complexity>on-set-limit) &&
    (off-set-complexity>off-set-limit);
}
ESTIMATE_COMPLEXITY(node,
on-set-complexity, off-set-complexity,
        child-on-set-complexity, child-off-set-complexity) {
    if IsAOr(node) {
        on-set-complexity = MIN(on-set-complexity +
        child-on-set-complexity,
            2^{sizeOf(support(node))} - 1);
        off-set-complexity =
        MIN(off-set-complexity * child-off-set-complexity,
            2^{sizeOf(support(node))} - 1);
    } else if isAAnd(node) {
        on-set-complexity =
        MIN(on-set-complexity * child-on-set-complexity,
            2^{sizeOf(support(node))} - 1);
        off-set-complexity =
        MIN(off-set-complexity + child-off-set-complexity,
            2^{sizeOf(support(node))} - 1);
    }
}
```

We claim:

1. A method of processing a network having one or more nodes representing Boolean functions, comprising the steps of:

estimating the complexity of the one or more nodes of the network;

determining whether the complexity of the one or more nodes exceeds a complexity limit; and reducing the complexity of the one or more nodes if the complexity limit is exceeded by the estimated complexity.

2. The method of claim 1, wherein the network represents an electronic circuit.

3. The method of claim 1, wherein the estimating step comprises the steps of:

for each node in the network:

determining a support of a node;

determining estimated complexities of any child nodes of the node;

and calculating an estimated complexity for the node based on the support and the estimated complexities of any child nodes.

4. The method of claim 1, wherein the estimating step comprises the steps of:

determining a Boolean function represented by a node;

determining a support of the node; and calculating an estimated complexity for the node based on the Boolean function represented by the node and the support of the node.

5. The method of claim 4, wherein the calculating step comprises the steps of:

estimating an on-set complexity for the node based on the support of the node and the Boolean function represented by the node; and estimating an off-set complexity for the node based on the support of the node and the Boolean function represented by the node.

6. The method of claim 1, wherein the step of reducing the complexity of the one or more nodes having the estimated complexity exceeding the complexity limit comprises the step of:

breaking the network at the one or more nodes having the estimated complexity exceeding the complexity limit.

7. The method of claim 6, wherein the step of breaking the network at the one or more nodes having the estimated complexity exceeding the complexity limit breaks the network at a first node and comprises the steps of:

creating a new node representing a same Boolean function as the first node; and making at least one child node of the first node a child node of the new node.

8. The method of claim 7, wherein the step of creating a new node further comprises the step of:

creating an internal node having the first node as a parent node and the new node as a child node.

9. The method of claim 1, wherein said one or more nodes comprises at least two nodes.

10. A computer system for optimizing an abstract representation of an electronic circuit, the computer system comprising:

a module for receiving a Boolean network having a parent node and a plurality of child nodes logically connected to the parent node, the Boolean network used to abstractly represent an electronic circuit;

a module for determining complexities of the parent node and the plurality of child nodes; and a module for breaking the Boolean network at the parent node in response to determined complexities of the parent node and the plurality of child nodes.

11. The computer system of claim 10, wherein the module for determining complexities of the parent node and the plurality of child nodes estimates the complexities of the nodes.

12. The computer system of claim 10, wherein the module for determining complexities of the parent node and the plurality of child nodes comprises:

a module for determining one or more on-set complexities of the parent node and the plurality of child nodes; and a module for determining one or more off-set complexities of the parent node and the plurality of child nodes.

13. The computer system of claim 12, wherein the module for determining the on-set complexity of the parent node comprises:

a module for determining the on-set complexity as the product of the on-set complexities of the plurality of child nodes logically connected to the parent node if the parent node is an AND node; and a module for determining the on-set complexity as the sum of the on-set complexities of the plurality of child nodes logically connected to the parent node if the parent node is an OR node.

14. The computer system of claim 12, wherein the module for determining the off-set complexity of the parent node comprises:

a module for determining the off-set complexity as the product of the off-set complexities of the plurality of child nodes logically connected to the parent node if the parent node is an OR node; and a module for determining the off-set complexity as the sum of the off-set complexities of the plurality of child nodes logically connected to the parent node if the parent node is an AND node.

15. The computer system of claim 10, wherein the module for breaking the Boolean network at the parent node in response to determined complexities of the at least one parent node and at least one child node comprises:

a module for breaking the Boolean network at the parent node in response to a determined complexity of the parent node exceeding a predetermined limit.

16. The computer system of claim 10, wherein said module for determining complexities of the parent node and the plurality of child nodes comprises a module for determining whether an estimated complexity of the parent node and each of the child nodes exceeds a complexity limit, and wherein said module for breaking the Boolean network at the parent node in response to, determined complexities of the parent node and the plurality of child nodes comprises a module for reducing the complexity of any of the parent node and child nodes whose estimated complexity exceeds the complexity limit.

17. A computer program product having a computer-readable medium having computer program instructions encoded thereon for optimizing a Boolean network comprising one or more nodes representing Boolean functions, the computer program instructions for:

estimating the complexity of a first node of the Boolean network;

determining whether the estimated complexity of said first node exceeds a complexity limit; and reducing the complexity of the Boolean network at said first node in response to a determination that the estimated complexity of said first node exceeds the complexity limit.

18. The computer program product of claim 17, wherein the computer program instructions for reducing the complexity of the Boolean network comprise instructions for:

inverting the estimated complexity of said first node having the estimated complexity exceeding the complexity limit.

19. The computer program product of claim 18, wherein the estimated complexity comprises an estimated on-set complexity and an estimated off-set complexity, and wherein the computer program instructions for inverting the estimated complexity comprise instructions for:

swapping the estimated on-set complexity with the estimated off-set complexity.

20. The computer program product of claim 18, further comprising instructions for:

choosing between inverting the Boolean network and breaking the Boolean network at said first node having the estimated complexity exceeding the complexity limit.

21. The computer program product of claim 18, wherein the computer program instructions comprise instructions for:

estimating the complexity of at least two nodes of the Boolean network, said at least two nodes including said first node;

determining whether the estimated complexity of said at least two nodes exceeds the complexity limit; and reducing the complexity of the Boolean network at any of said at least two nodes whose estimated complexity exceeds the complexity limit.

22. The computer program product of claim 17, wherein the computer program instructions for reducing the complexity of the Boolean network comprise instructions for:

breaking the Boolean network at said first node having the estimated complexity exceeding the complexity limit.

* * * * *

UNITED STATES PATENT AND TRADEMARK OFFICE
CERTIFICATE OF CORRECTION

PATENT NO. : 6,397,370 B1
DATED : May 28, 2002
INVENTOR(S) : Jean-Michel Fernandez and Gerard Tarroux It is certified that error appears in the above-identified patent and that said Letters Patent is hereby corrected as shown below:

Column 10,
Line 7, please insert -- , -- after the word "on-set-complexity".

Signed and Sealed this

Sixth Day of August, 2002

Attest:

JAMES E. ROGAN
Attesting Officer — Director of the United States Patent and Trademark Office

UNITED STATES PATENT AND TRADEMARK OFFICE
CERTIFICATE OF CORRECTION

PATENT NO. : 6,397,370 B1 Page 1 of 1
DATED : May 28, 2002
INVENTOR(S) : Jean-Michel Fernandez and Gerard Tarroux It is certified that error appears in the above-identified patent and that said Letters Patent is hereby corrected as shown below:

<u>Title page,</u>
Item [73], Assignee, please replace the word "Candence" with -- Cadence --.

Signed and Sealed this

Twenty-fifth Day of February, 2003

JAMES E. ROGAN
*Director of the United States Patent and Trademark Office*